(12) United States Patent
Paidimarri et al.

(10) Patent No.: US 9,853,651 B2
(45) Date of Patent: *Dec. 26, 2017

(54) SYSTEMS AND METHODS OF LOW POWER CLOCKING FOR SLEEP MODE RADIOS

(71) Applicant: TEXAS INSTRUMENTS INCORPORATED, Dallas, TX (US)

(72) Inventors: Arun Paidimarri, White Plains, NY (US); Danielle Griffith, Richardson, TX (US); Alice Wang, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/430,182

(22) Filed: Feb. 10, 2017

(65) Prior Publication Data

US 2017/0155397 A1 Jun. 1, 2017

Related U.S. Application Data

(63) Continuation of application No. 13/406,849, filed on Feb. 28, 2012.

(51) Int. Cl.
| | |
|---|---|
| *H03B 5/20* | (2006.01) |
| *H03B 5/32* | (2006.01) |
| *H03B 1/00* | (2006.01) |
| *H03L 7/24* | (2006.01) |
| *H03B 5/24* | (2006.01) |

(52) U.S. Cl.
CPC ............ *H03L 7/24* (2013.01); *H03B 1/00* (2013.01); *H03B 5/20* (2013.01); *H03B 5/24* (2013.01); *H03B 5/32* (2013.01)

(58) Field of Classification Search
CPC ... H03B 5/20; H03B 5/24; H03B 5/30; H03B 5/32; H03K 3/0231
USPC .................. 331/44, 46, 47, 111, 143, 158
See application file for complete search history.

(56) References Cited

U.S. PATENT DOCUMENTS

| | | | |
|---|---|---|---|
| 4,241,435 | A | 12/1980 | Fujita et al. |
| 5,670,915 | A | 9/1997 | Cooper et al. |
| 5,729,722 | A | 3/1998 | Matsumoto |
| 5,767,747 | A | 6/1998 | Pricer |
| 5,844,435 | A | 12/1998 | Grundvig |
| 6,020,792 | A | 2/2000 | Nolan et al. |
| 6,029,061 | A | 2/2000 | Kohlschmidt |
| 6,650,189 | B1 | 11/2003 | Romao |
| 7,034,627 | B1 | 4/2006 | Kudari |
| 7,612,624 | B2 | 11/2009 | Lim et al. |
| 7,843,279 | B2 | 11/2010 | Chou et al. |

(Continued)

*Primary Examiner* — Levi Gannon
(74) *Attorney, Agent, or Firm* — Ronald O. Neerings; Charles A. Brill; Frank D. Cimino

(57) ABSTRACT

Systems and methods of low power docking of sleep mode radios are disclosed herein. In an example embodiment, a crystal oscillator is purposefully mistuned to achieve lower power consumption, and then synchronized using a high frequency crystal oscillator. In an alternative embodiment, the input offset voltages of the comparator in an RC oscillator are cancelled, which allows low power operation and high accuracy performance when tuned to the high frequency crystal. A lower power comparator may be used with higher input offset voltages but still achieve higher accuracy. The RC circuit is switched back and forth on opposite phases of the output, cancelling the offset voltage on the inputs of the comparator.

25 Claims, 4 Drawing Sheets

(56) References Cited

U.S. PATENT DOCUMENTS 7,847,648 B2    12/2010   Hu et al.
2005/0275475 A1    12/2005   Houldsworth

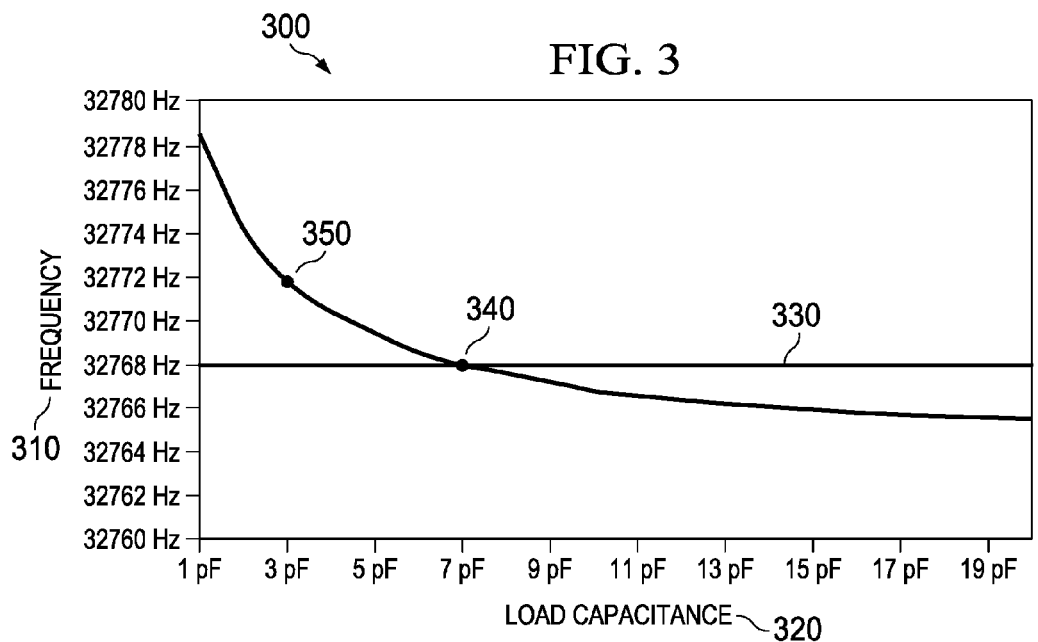
FIG. 3
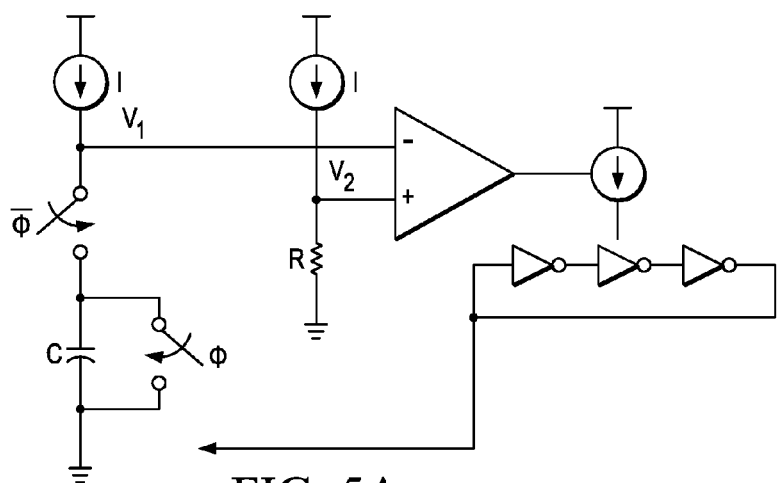
FIG. 4
FIG. 5A
(PRIOR ART)

SYSTEMS AND METHODS OF LOW POWER CLOCKING FOR SLEEP MODE RADIOS

This application is a Continuation of application Ser. No. 13/406,849 filed Feb. 28, 2012.

TECHNICAL FIELD

The present disclosure is generally related to electronics and, more particularly, is related to oscillators.

BACKGROUND

An electronic oscillator is an electronic circuit that produces a repetitive electronic signal, often a sine wave or a square wave. They are widely used in innumerable electronic devices. Common examples of signals generated by oscillators include signals broadcast by radio and television transmitters, clock signals that regulate computers and quartz clocks, and the sounds produced by electronic beepers and video games. The harmonic, or linear, oscillator produces a sinusoidal output.

The basic form of a harmonic oscillator is an electronic amplifier connected in a positive feedback loop with its output fed back into its input through a filter. When the power supply to the amplifier is first switched on, the amplifier's output consists only of noise. The noise travels around the loop and is filtered and re-amplified until it increasingly resembles a sine wave at a single frequency.

An oscillator circuit which uses an RC network, a combination of resistors and capacitors, for its frequency selective part is called an RC oscillator. Two configurations are common. One is called a Wien bridge oscillator. In this circuit, two RC circuits are used, one with the RC components in series and one with the RC components in parallel. The Wien Bridge is often used in audio signal generators because it can be easily tuned using a two-section variable capacitor or a two section variable potentiometer (which is more easily obtained than a variable capacitor suitable for generation at low frequencies).

The second common design is called a "Twin-T" oscillator as it uses two "T" RC circuits operated in parallel. One circuit is an R-C-R "T" which acts as a low-pass filter. The second circuit is a C-R-C "T" which operates as a high-pass filter. Together, these circuits form a bridge which is tuned at the desired frequency of oscillation. The signal in the C-R-C branch of the Twin-T filter is advanced, and in the R-C-R branch, delayed, so they may cancel one another for frequency $f=1/(2\pi RC)$ if $x=2$; if it is connected as a negative feedback to an amplifier, and $x>2$, the amplifier becomes an oscillator.

In a crystal oscillator, a piezoelectric crystal (commonly quartz) may take the place of the filter to stabilize the frequency of oscillation. These kinds of oscillators contain quartz crystals that mechanically vibrate as resonators, and their vibration determines the oscillation frequency. Crystals have very high Q-factor and also better temperature stability than tuned circuits, so crystal oscillators have much better frequency stability than RC oscillators. Crystal oscillators are commonly used to stabilize the frequency of radio transmitters, and to generate the clock signal in computers. The Pierce oscillator circuit is often used for crystal oscillators.

In any oscillator circuit, current consumption increases proportional to the system clock frequency. Therefore, keeping the system clock as low as possible is critical to reducing power consumption. The clock frequency is affected by a number of factors and there are heretofore unaddressed needs with previous low power solutions.

SUMMARY

Example embodiments of the present disclosure provide systems of low power clocking for sleep mode radios. Briefly described, in architecture, one example embodiment of the system, among others, can be implemented as follows: a high frequency, accurate oscillator; and a lower power less accurate oscillator enabled during a sleep mode of a radio, the lower power less accurate oscillator (LPLAO) configured to be calibrated using the high frequency accurate oscillator.

Embodiments of the present disclosure can also be viewed as providing methods for low power clocking for sleep mode radios. In this regard, one embodiment of such a method, among others, can be broadly summarized by the following steps: generating an oscillation frequency with low accuracy and low power for use during a sleep mode of at least one of a receiver, a transmitter, and a transceiver; and calibrating the oscillation frequency with a higher accuracy and higher power oscillator.

BRIEF DESCRIPTION OF THE DRAWINGS

FIG. 3 is a graph of load capacitance for an example crystal oscillator.

FIG. 4 is a table of bias current for the example crystal of FIG. 3.

FIG. 5A is a circuit diagram of a prior art RC oscillator.

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Figure 1:
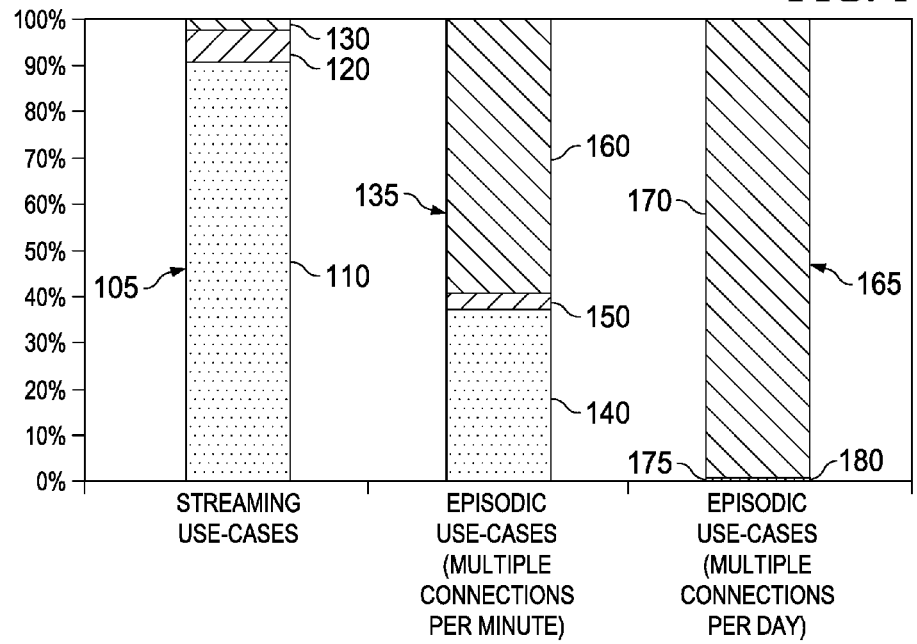
FIG. 1 is a graph of various sleep mode use-cases.

Systems and methods of low power clocking for sleep mode radios may be used in a receiver, transmitter, or transceiver that is on for a small amount of time such that the power profile has a very low duty cycle. Although possibly used in a cell phone, the systems and methods disclosed herein may be more applicable in applications such as sensor nodes, utility metering, etc. with much longer sleep periods. FIG. 1 provides graph 100 of example use-cases showing the percentage of total power used in system mode. In streaming use case 105, RX/TX mode 110 consumes 90% of the total power, MCU and idle mode 120 consumes 8% of the total power, and sleep mode 130 consumes 2% of the total power.

In episodic use-case 135 with multiple connections per minute, RX/TX mode 140 consumes 37% of the total power, MCU and idle mode 150 consumes 3% of the total power, and sleep mode 160 consumes 60% of the total power. In episodic use-case 165 with multiple connections per day, sleep mode 170 occurs over 99% of the time, and MCU and idle mode 175 and RX/TX mode 180 are insignificant. The disclosed systems and methods may be used in any application that needs an accurate real time clock for synchronized communication with an external system or transceiver. Although they could be used in any application, the multiple connections per day episodic use case is the most applicable. The disclosed systems and methods could be applied, as a non-limiting example, to an oscillator clock as well as a real time clock.

In an example embodiment, a sensor node s configured to wake up once a day, for instance, to communicate to a remote point and transfer or receive data or instructions, for example. Waking up for a second out the day, for example, may be sufficient. In this example application, the period of wakeup is sufficient to receive the operative data. When the application is in operation mode (as opposed to sleep mode), it consumes one thousand, ten thousand or one hundred thousand times more power, for example, than when it is in sleep mode. If the application inaccurately tracks time with the oscillator circuit, the application may turn on significantly in advance of when it should have in order to receive the data or instructions which can greatly increase the average power consumption.

The more accurate that the time keeping is, the shorter the period for waking up to receive or transmit data and to resynchronize the clock. In operational mode, the application may consume ten thousand times more power than when it is keeping track of the time. So when the system is in sleep mode, only keeping track of the time, that power consumption is extremely important because it may account for 99.9% of the time. When the application is not in sleep mode, the power consumption is much higher, but the high power consumption is for such a short duration that the consumed power is very little compared to the rest of the overall power consumption. In a long sleep mode application, one of the overriding factors impacting the total power consumption is the power that it draws during the sleep mode. Another important factor is the accuracy of the clock.

In legacy applications, sleep mode power may be in the range of one to five microamps, for example. The disclosed systems and methods may decrease that power dramatically without affecting the accuracy of the time keeping. In the disclosed systems and methods of low power sleep mode radios, a low power inaccurate clock is used during sleep mode, and then synchronized with an accurate clock during operational mode.

In an example embodiment, a crystal oscillator is purposefully mistuned to achieve lower power consumption, and then synchronized using a high frequency crystal oscillator. Comparing the inaccurate low frequency clock to a highly accurate high frequency clock allows the real time clock to be generated by digitally adjusting the inaccurate low frequency clock by a known amount. In the past, the accuracy versus power consumption has been a trade off, so the more accurate the oscillator, the more power consumed. In calibrating the lower power inaccurate clock, there are two different clocks. In an example application, one clock, the real time clock which keeps track of the time to initiate a wake up is a 32.768 kilohertz clock, and the other oscillator, which is used as a reference frequency for a phase locked loop (PLL) is a megahertz range oscillator. Applications with a receiver or transmitter may implement a PLL. The megahertz range oscillator experiences much higher power consumption, but for a brief amount of time. Since the time is so short, the performance of the oscillator is more important than the power consumption. For example, a 24 megahertz crystal oscillator is awakened periodically, used to calibrate the 32.768 kilohertz oscillator and then turned back off again. It adds very little to total power consumption but it enables an improvement in the accuracy of the low frequency clock. The 32.768 kilohertz oscillator may be designed to achieve very low power consumption at the expense of accuracy because it will be recalibrated periodically.

In an example embodiment, an external crystal implementation is used for the low power oscillator. As provided in graph 300 of FIG. 3, the operating frequency of the crystal oscillator is dependent on the load capacitance. The crystal has specified load capacitance to achieve particular frequencies. When the appropriate load capacitance is applied, the crystal oscillator produces the specified frequency. For example, with the particular crystal of FIG. 3, when the load capacitance is seven picofarads at point 340, the output oscillates at 32,768 hertz. The power consumption is also approximately proportional to the load capacitance as provided in FIG. 4. If the load capacitance is seven picofarads, the supply current is hundreds of nanoamps, for example. However, if the load capacitance is decreased, the power consumption decreases significantly. In an example crystal, if the load capacitance is reduced to two picofarads, the supply current decreases to 30 nanoamps. If, on the other hand, the load capacitance is increased to twelve picofarads, the supply current increases to 600 nanoamps.

Figure 2:
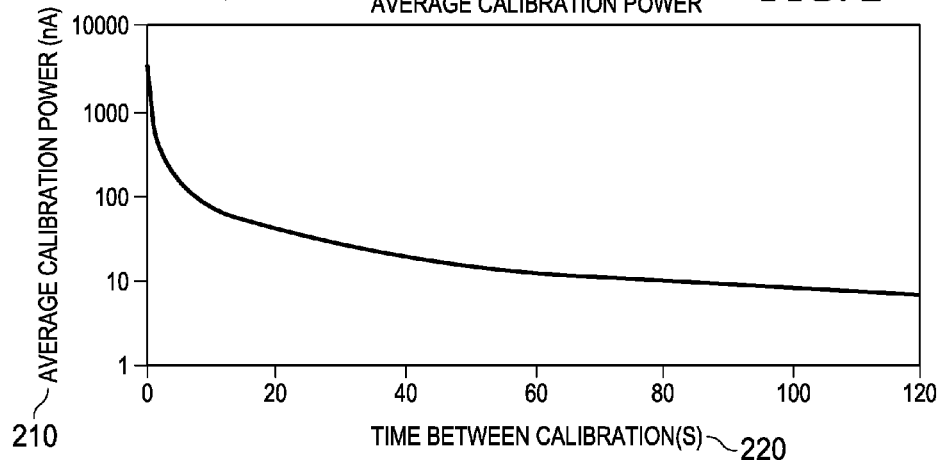
FIG. 2 is a graph of average calibration power in an example embodiment.

In legacy designs, the capacitance may have been set to the capacitance specified for the desired frequency, which tunes the crystal frequency. So if it takes two hundred nanoamps to work at seven picofarads, which is the specified frequency, and the output capacitance is changed to two picofarads, the supply current decreases by one hundred seventy nanoamps at the expense of being less accurate. However, this is acceptable because it will be calibrated with the more accurate oscillator. FIG. 2 shows an example of the average calibration power vs. time between calibrations. If the low frequency oscillator is recalibrated only once every 120 seconds, the average current required to do the calibration is only eight nanoamps. The low level of output capacitance is limited to the parasitic capacitance of the output pin, which, in this example, is two picofarads. The sleep mode current has decreased from two hundred nanoamps to thirty nanoamps plus the eight nanoamps for the calibration, while achieving even better accuracy than could be achieved by using a properly tuned 32.768 kHz oscillator by calibrating with the twenty-four megahertz crystal.

Figure 5B:
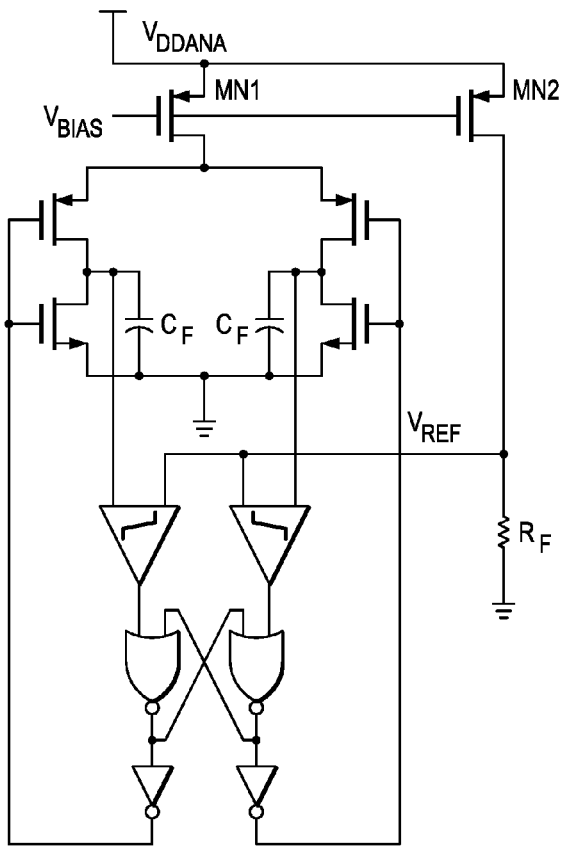
FIG. 5B is a circuit diagram of a prior art RC oscillator.

In an alternative embodiment, an RC oscillator is used. Similarly to what is described in previous paragraphs, an inaccurate low frequency RC oscillator may be calibrated to a high frequency crystal oscillator to achieve a lower average power consumption with improved accuracy. Also, if a low frequency RC oscillator is used, no low frequency external crystal is needed. However, accuracy of an RC oscillator is less than a crystal-based oscillator, so the calibration would likely be performed more frequently. Further improvements to the RC oscillator also are possible. In prior-art circuits provided in FIG. 5A and FIG. 5B, there are two different architectures that are used, and the accuracy and the power consumption are commensurate. Higher accuracy results in higher power consumption.

Figure 7:
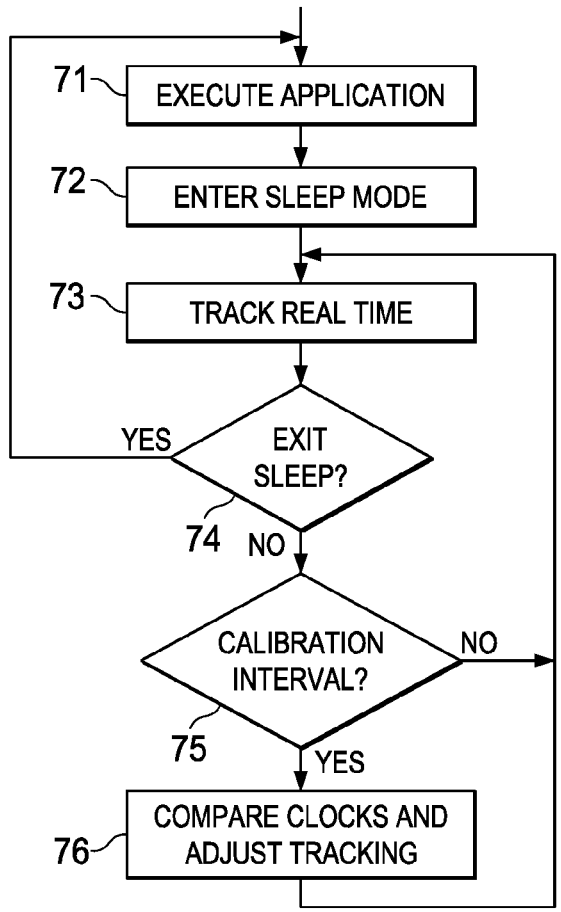
FIG. 7 illustrates operations according to example embodiments of the present work.

FIG. 7 illustrates operations described above. After the communications application is executed at 71 in FIG. 7, sleep mode is entered at 72. Then, real time is tracked at 73 and, at each calibration interval (75), the high and low accuracy clocks are compared for real time tracking adjustment (76). The operations at 73, 75 and 76 continue as shown until sleep mode is exited (74) to execute the communications application again at 71.

Figure 8:
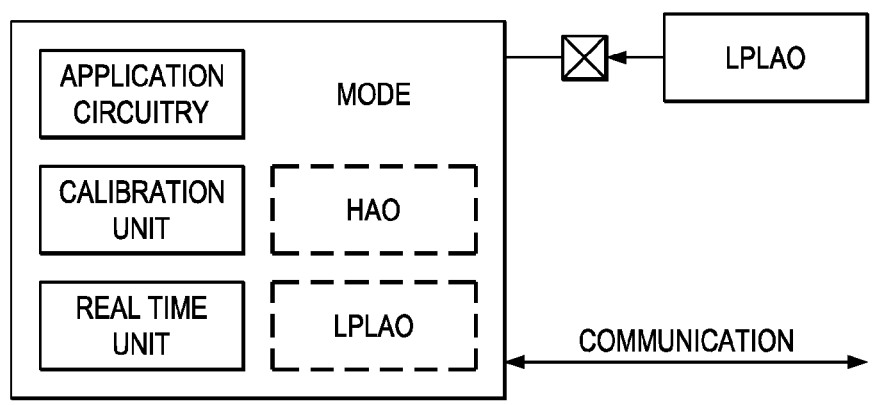
FIG. 8 diagrammatically illustrates a communications apparatus according to example embodiments of the present work.

FIG. 8 diagrammatically illustrates a communications apparatus constructed in accordance with the foregoing descriptions. The illustrated apparatus includes a communications node having application circuitry that executes the communications application. Also provided in the node are a high-accuracy oscillator (HAO), a real time unit that tracks real time, and a calibration unit that compares a higher frequency clock from the HAO to a lower frequency clock from an external LPLAO, for real time tracking adjustment. The external LPLAO is provided as a crystal oscillator experiencing only the parasitic capacitance of its coupling to a pin of the communications node. Shown by broken line in FIG. 8 are embodiments wherein the LPLAO (e.g., an RC oscillator) need not be external to the communications node.

Figure 6:
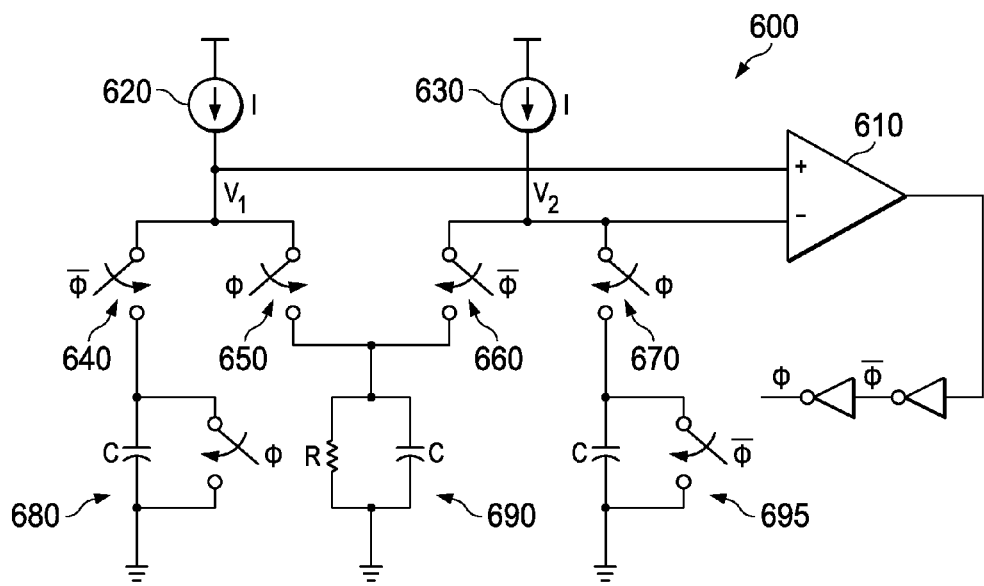
FIG. 6 is a circuit diagram of an example embodiment of a system of low power clocking of a sleep mode radio.

FIG. 6 provides an alternative embodiment in which switching or chopping is used to cancel offset voltages in the comparator inputs. A lower power comparator may be used with higher input offset voltages but still achieve higher accuracy using example embodiments of the disclosed systems and methods of low power clocking for sleep mode radios. The RC circuit is switched back and forth on opposite phases of the output, cancelling the offset voltage on the inputs of the comparator. In an example embodiment provided in circuit 600 of FIG. 6, the inputs to comparator 610 are V1 and V2. Each of the inputs of comparator 610 are alternately switched back and forth between resistor capacitor combination 690 and capacitor 680 and capacitor 695. Switches 640 and 660 close on one phase of the output signal and switches 650 and 670 close on the opposite phase of the output signal. When switches 640 and 660 are closed, capacitor 680 is connected to the positive input of comparator 610 and resistor-capacitor combination 690 is connected to the negative input of comparator 610. When switches 650 and 670 are closed, capacitor 695 is connected to the negative input of comparator 610 and resistor-capacitor combination 690 is connected to the positive input of comparator 610. Any offset voltage that appears on one side during one of the periods will appear on the other side in the other direction for the other period so that the voltages cancel out. In an example embodiment, the calibration to an accurate high frequency oscillator technique and the chopping technique may be implemented together to further reduce the power consumption.

Although the present disclosure has been described in detail, it should be understood that various changes, substitutions and alterations can be made thereto without departing from the spirit and scope of the disclosure as defined by the appended claims.

The invention claimed is:

1. A communications apparatus, comprising:
   a real time unit configured for tracking real time based on a first clock;
   application circuitry that executes a communications application based on a second clock during an operational mode, said application circuitry configured to enter a sleep mode for a period of real time measured by said real time unit during said sleep mode;
   a high-accuracy oscillator configured to provide said second clock at a frequency that is higher than a frequency of said first clock;
   a low-power low-accuracy oscillator (LPLAO) purposely mistuned by lowering a load capacitance of the LPLAO to be less than what is required for the LPLAO to operate at a specified frequency for the first clock; and
   a calibration unit configured for comparing said first clock with said second clock, and adjusting said tracking in accordance with a digital adjustment amount determined by said comparing.

2. The apparatus of claim 1, wherein said comparing occurs at regular intervals.

3. The apparatus of claim 1, wherein said real time unit and said application circuitry and said high-accuracy oscillator and said calibration unit are provided in a communications node; and wherein said LPLAO is externally coupled to said communications node.

4. The apparatus of claim 1, wherein said comparing and said adjusting occur during said sleep mode.

5. The apparatus of claim 4, wherein said comparing and said adjusting occur at selected intervals.

6. The apparatus of claim 1, wherein said high-accuracy oscillator is active during said sleep mode only at said selected intervals.

7. The apparatus of claim 1, wherein said comparing and said adjusting occur at selected intervals.

8. A method of operating a communications apparatus, comprising:
   tracking real time based on a first clock provided by a low-power low-accuracy oscillator (LPLAO) purposely mistuned by lowering a load capacitance of the LPLAO to be less than what is required for the LPLAO to operate at a specified frequency for the first clock to provide said first clock using less power but with less accuracy than if correctly tuned for said specified frequency;
   during an operational mode, executing a communications application based on a second clock provided by a high-accuracy oscillator at a frequency that is higher than a frequency of said first clock;
   entering a sleep mode for a period of real time measured by said tracking;
   comparing said first clock to said second clock; and
   adjusting said tracking in accordance with a digital adjustment amount determined by said comparing.

9. The method of claim 8, wherein said comparing and said adjusting occur during said sleep mode.

10. The method of claim 9, wherein said comparing and said adjusting occur at selected intervals.

11. The method of claim 10, including activating the high-accuracy oscillator during said sleep mode only at said selected intervals.

12. The method of claim 8, wherein said comparing and said adjusting occur at selected intervals.

13. A communications apparatus, comprising:
   a real time unit configured for tracking real time based on a first clock;
   application circuitry that executes a communications application based on a second clock during an operational mode, said application circuitry configured to enter a sleep mode for a period of real time measured by said real time unit during said sleep mode;
   a high-accuracy oscillator configured to provide said second clock at a frequency that is higher than a frequency of said first clock;

an oscillator purposely mistuned by lowering a load capacitance of the oscillator to be less than what is required for the oscillator to operate at a specified frequency for the first clock; and a calibration unit configured for comparing said first clock with said second clock, and adjusting said tracking in accordance with a digital adjustment amount determined by said comparing.

14. The apparatus of claim 13, wherein said comparing occurs at regular intervals.

15. The apparatus of claim 13, wherein said real time unit and said application circuitry and said high-accuracy oscillator and said calibration unit are provided in a communications node, and wherein said oscillator is externally coupled to said communications node.

16. The apparatus of claim 13, wherein said comparing and said adjusting occur during said sleep mode.

17. The apparatus of claim 16, wherein said comparing and said adjusting occur at selected intervals.

18. The apparatus of claim 13, wherein said high-accuracy oscillator is active during said sleep mode only at said selected intervals.

19. The apparatus of claim 13, wherein said comparing and said adjusting occur at selected intervals.

20. A method of operating a communications apparatus, comprising:

tracking real time based on a first clock;

executing a communications application based on a second clock during an operational mode, said application circuitry configured to enter a sleep mode for a period of real time measured by said real time unit during said sleep mode;

providing said second clock at a frequency that is higher than a frequency of said first clock;

purposely mistuning an oscillator by lowering a load capacitance of the oscillator to be less than what is required for the oscillator to operate at a specified frequency for the first clock; and comparing said first clock with said second clock, and adjusting said tracking in accordance with a digital adjustment amount determined by said comparing.

21. The method of claim 20, wherein said comparing and said adjusting occur during said sleep mode.

22. The method of claim 21, wherein said comparing and said adjusting occur at selected intervals.

23. The method of claim 22, including activating the high-accuracy oscillator during said sleep mode only at said selected intervals.

24. The method of claim 20, wherein said comparing and said adjusting occur at selected intervals.

25. The method of claim 20, wherein the oscillator is a low-power low-accuracy oscillator (LPLAO).

* * * * *